(12) United States Patent
Fujimoto et al.

(10) Patent No.: US 7,832,272 B2
(45) Date of Patent: *Nov. 16, 2010

(54) TUNING FORK VIBRATOR AND VIBRATORY GYROSCOPE USING THE SAME

(75) Inventors: Katsumi Fujimoto, Toyama (JP); Masato Koike, Toyama-ken (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 33 days.

This patent is subject to a terminal disclaimer.

(21) Appl. No.: 12/355,022

(22) Filed: Jan. 16, 2009

(65) Prior Publication Data

US 2009/0126488 A1    May 21, 2009

Related U.S. Application Data

(63) Continuation of application No. PCT/JP2007/057824, filed on Apr. 9, 2007.

(30) Foreign Application Priority Data

Jul. 21, 2006    (JP)    .............................. 2006-199148

(51) Int. Cl.
    G01P 9/04    (2006.01)
    G01C 19/56    (2006.01)
(52) U.S. Cl. ................................. 73/504.12; 73/504.16
(58) Field of Classification Search .............. 73/504.16, 73/504.12, 504.14; 310/370
    See application file for complete search history.

(56) References Cited

U.S. PATENT DOCUMENTS 3,697,766 A  * 10/1972 Ganter et al. ............... 310/348
3,944,862 A  *  3/1976 Shimoi et al. ............... 310/312
3,946,257 A  *  3/1976 Kawamura ................... 310/370
4,410,827 A  * 10/1983 Kogure ........................ 310/370
4,771,202 A  *  9/1988 Takahashi .................... 310/312
5,698,874 A  * 12/1997 Hayashi ....................... 257/233

(Continued)

FOREIGN PATENT DOCUMENTS

| JP | 10-111132 | 4/1998 |
| JP | 2001-082963 | 3/2001 |
| JP | 2004-61486 | 2/2004 |
| JP | 2004-61846 | 2/2004 |
| JP | 2004-242256 | 8/2004 |
| JP | 2009-258210 | * 11/2009 |

OTHER PUBLICATIONS

PCT/JP2007/057824 International Search Report dated May 1, 2007.
PCT/JP2007/057824 Written Opinion dated May 1, 2007.

*Primary Examiner*—Helen C. Kwok
(74) *Attorney, Agent, or Firm*—Dickstein Shapiro LLP

(57) ABSTRACT

A tuning fork vibrator includes a vibrating body having the shape of a tuning fork as a whole. The vibrating body includes legs having a meandering shape and a base coupled to an end of the legs. A support is formed so as to extend between the legs from the base. Two electrodes arranged separately in the width direction are formed on one of the legs, and two electrodes arranged separately in the width direction are formed on the other of the legs. The outermost electrodes on each of the legs are connected to a connection electrode formed on the base. The connection electrode is formed so as to extend toward the support. The innermost electrodes on each of the legs are formed so as to extend toward the support through the base. A common electrode is formed on a second principal surface of the vibrating body. A vibratory gyroscope can be formed using the tuning fork vibrator.

14 Claims, 5 Drawing Sheets

U.S. PATENT DOCUMENTS

| | | | |
|---|---|---|---|
| 6,531,805 B2 * | 3/2003 | Ikeda et al. | 310/331 |
| 7,210,350 B2 * | 5/2007 | Ogura | 73/504.12 |
| 7,478,558 B2 * | 1/2009 | Fujii et al. | 73/504.16 |
| 2004/0007065 A1 | 1/2004 | Fujimoto et al. | |
| 2009/0133497 A1 * | 5/2009 | Fujimoto et al. | 73/504.12 |
| 2009/0167118 A1 * | 7/2009 | Yoshimatsu et al. | 310/370 |

* cited by examiner

TUNING FORK VIBRATOR AND VIBRATORY GYROSCOPE USING THE SAME

CROSS REFERENCE TO RELATED APPLICATIONS

The present application is a continuation of International Application No. PCT/JP2007/057824, filed Apr. 9, 2007, which claims priority to Japanese Patent Application No. JP2006-199148, filed Jul. 21, 2006, the entire contents of each of these applications being incorporated herein by reference in their entirety.

FIELD OF THE INVENTION

The present invention relates to tuning fork vibrators and vibratory gyroscopes using the same and, in particular, for example, to a tuning fork vibrator utilizing opening and closing vibrations of legs and a vibratory gyroscope using the same.

BACKGROUND OF THE INVENTION

FIG. 8 is a perspective view of a traditional turning-fork piezoelectric vibrator, looking from a first side thereof. FIG. 9 is a perspective view of that piezoelectric vibrator, looking from a second side thereof. A piezoelectric vibrator 1 includes a turning fork vibrating body 2. The vibrating body 2 is constructed of two bonded tuning-fork piezoelectric substrates. These piezoelectric substrates are oppositely polarized in their thickness directions. Two driving electrodes 3a and 3b are formed on a first principal surface of the vibrating body 2. The driving electrodes 3a and 3b are formed separately in a width direction of each of two legs. The driving electrodes 3a and 3b formed on one of the two legs are connected to the driving electrodes 3a and 3b formed on the other of the two legs, respectively, at the base of the vibrating body 2. Two detecting electrodes 4a and 4b are formed on a second principal surface of the vibrating body 2. These detecting electrodes 4a and 4b are formed in the two legs of the vibrating body 2, respectively.

When the piezoelectric vibrator 1 is used as a vibratory gyroscope, an oscillation circuit is connected between the two driving electrodes 3a and 3b. This oscillation circuit causes the two legs of the vibrating body 2 to vibrate so as to open and close. At this time, the piezoelectric vibrator 1 is driven by self-excited vibration at that resonant frequency. The two detecting electrodes 4a and 4b are connected to a differential circuit. When, in the state where the two legs of the vibrating body 2 vibrate so as to open and close, the vibrating body 2 rotates about an axis perpendicular to the two legs thereof, the vibration direction of the legs is changed by the Coriolis force. Because of this, signals having opposite phases corresponding to the Coriolis force are output from the detecting electrodes 4a and 4b, and the difference of the output signals from the detecting electrodes 4a and 4b is output from the differential circuit. Accordingly, the use of measurement of a signal of the differential circuit can detect an angular velocity of rotation applied to the piezoelectric vibrator 1 (see Patent Document 1).

There also is a piezoelectric vibrator 5 illustrated in FIGS. 10(a) and 10(b). The piezoelectric vibrator 5 includes two legs 6a and 6b. Each of these legs 6a and 6b is constructed of a vibrating portion in which two elongated piezoelectric substrates are bonded. In each vibrating portion, the bonded piezoelectric substrates are polarized in the opposite thickness directions thereof. Two electrodes 7a and 7b and two electrodes 7c and 7d arranged separately in the width direction are formed on a first principal surface of the vibrating portion. The two legs 6a and 6b are arranged in parallel with each other, a base 8 is formed on a first end of a second principal surface of the legs 6a and 6b, and they are formed in the shape of a tuning fork as a whole. Further, an electrode 9 is formed on the second principal surface of the vibrating portion constituting the legs 6a and 6b so as to extend from the side surface of the base 8.

When the piezoelectric vibrator 5 is used as a vibratory gyroscope, an oscillation circuit is connected between the inwardly adjacent electrodes 7b and 7c of the adjacent legs 6a and 6b and the outwardly adjacent electrodes 7a and 7d thereof. The outer electrodes 7a and 7d are connected to a differential circuit. Thus, the oscillation circuit causes the legs 6a and 6b to vibrate so as to open and close, as in the case of the piezoelectric vibrator illustrated in FIGS. 8 and 9. When the piezoelectric vibrator 5 rotates about an axis parallel to the two legs 6a and 6b, the vibration direction of the legs 6a and 6b is changed by the Coriolis force, and a signal corresponding to the Coriolis force is output from the differential circuit. Accordingly, the use of measurement of a signal from the differential circuit can detect an angular velocity of rotation applied to the piezoelectric vibrator 5 (see Patent Document 2).

Patent Document 1: Japanese Unexamined Patent Application Publication No. 10-111132

Patent Document 2: Japanese Unexamined Patent Application Publication No. 2004-61486

SUMMARY OF THE INVENTION

With the miniaturization of a camcorder incorporating a vibratory gyroscope, it becomes increasingly necessary for the vibratory gyroscope to reduce its size and profile. Here, the resonant frequency ωr of a tuning fork vibrator, as described above, is represented by the following expression:

$$\omega r = \left(\frac{1.875}{L}\right)^2 \sqrt{\frac{EI}{\rho H^2}}$$

where L is the effective length of the tuning fork vibrator, H is the thickness thereof, ρ is the density thereof, E is the Young's modulus thereof, and I is the moment of inertia thereof.

The above expression reveals that the miniaturization of a tuning fork vibrator increases the resonant frequency thereof. In the case of a vibrating-reed type vibrator, "1.875" in the above expression is "3.927." Thus, for the same length, a vibrating-reed type vibrator has a high resonant frequency 4.4 times that of a tuning fork vibrator. A tuning fork vibrator can obtain the same resonant frequency with a length half that of a vibrating-reed type vibrator. If the resonant frequency of a tuning fork vibrator used in a vibratory gyroscope is increased, the difference to a camera shake applied to a camcorder is increased, so the sensitivity for detecting an angular velocity of rotation is reduced. The resonant frequency of a typical vibratory gyroscope is at or below 50 kHz. For example, for a typical piezoelectric ceramic bimorph vibrator having a thickness of 0.4 mm and a length of 7 mm, the resonant frequency is approximately 30 kHz.

As an angular velocity sensor such as a vibratory gyroscope has become available for use in a portable device, an angular velocity sensor having a size of 3 mm or smaller is being required. If a vibrating-reed type minute vibrator is used as a vibratory gyroscope, a problem arises in which the width of the vibrator is so narrow that it is difficult to form discrete electrodes for exciting the vibrating-reed type vibrator so as to generate flexural vibrations therein. One approach to addressing this problem is the use of a tuning fork vibrator, as described above. With the use of a tuning fork vibrator, the length can be reduced to about half that of a vibrating-reed type vibrator. In the future, there is a need to fabricate an ultra-small vibrator that utilizes, for example, a piezoelectric thin film. However, to fabricate such an ultra-small vibrator, even if a tuning fork vibrator is used, the resonant frequency is too high to obtain favorable sensitivity.

Accordingly, it is a principal object of the present invention to provide a tuning fork vibrator usable as a small vibratory gyroscope having satisfactory detection sensitivity and also provide a vibratory gyroscope using the tuning fork vibrator.

The present invention is a tuning fork vibrator including a plurality of legs having a first principal surface and a second principal surface and having a meandering shape, a base disposed on first ends of the plurality of legs in longitudinal directions thereof, the base being connected to at least two of the plurality of legs such that the at least two legs extend along the same longitudinal direction, and two electrodes formed on the first principal surface of the plurality of legs so as to be separated in width directions thereof.

The application of a driving signal to the electrodes formed on the legs excites the legs of the tuning-fork vibrating body such that opening and closing vibrations occur in the legs. Here, forming each of the legs in a meandering shape can ensure a length of the leg necessary to maintain a low resonant frequency even when the entire tuning fork vibrator is miniaturized. Accordingly, even when the entire tuning fork vibrator is miniaturized, an increase in the resonant frequency can be suppressed.

In the tuning fork vibrator, the plurality of legs may be formed symmetrically with respect to the base.

Forming the plurality of legs symmetrically with respect to the base can provide the tuning fork vibrator with the legs extending along both sides of the base. Accordingly, vibrating the legs at both sides of the base can obtain a larger detection signal.

The tuning fork vibrator may further include an elongated support for supporting the vibrating body in midair, the support extending from the base and being formed between the plurality of legs.

Because the vibrating body is supported in midair using the support, the vibrating body can be supported at the node of the legs vibrating so as to open and close.

Furthermore, each of the plurality of legs may include a vibrating body in which two piezoelectric substrates are bonded, and polarization directions of the two piezoelectric substrates may be opposite to each other.

Each of the plurality of legs may include a piezoelectric substrate polarized in a thickness direction thereof and a non-piezoelectric substrate bonded thereto.

Moreover, each of the plurality of legs may include a non-piezoelectric substrate and a piezoelectric film, the piezoelectric film being formed on a first principal surface of the non-piezoelectric substrate and polarized in a thickness direction thereof.

The piezoelectric vibrator may have any configuration as long as a driving signal causes the legs to vibrate so as to open and close. Accordingly, two piezoelectric substrates may be bonded to form the legs, or a piezoelectric substrate and a non-piezoelectric substrate may be bonded to form the legs.

Further, the use of a thin-film structure in the piezoelectric body can achieve the low-profile tuning fork vibrator.

The present invention is also a vibratory gyroscope including the tuning fork vibrator according to any one of the foregoing descriptions, a driving unit for applying a driving signal to the electrodes formed on the legs of the tuning fork vibrator, and a detecting unit for detecting a signal generated in the electrodes of the legs of the tuning fork vibrator.

A driving signal applied from the driving unit causes the legs of the tuning fork vibrator to vibrate so as to open and close, and a detection signal corresponding to the Coriolis force output from the electrodes formed on the legs upon the application of an angular velocity of rotation is detected by the detecting unit. Accordingly, the angular velocity of rotation applied to the tuning fork vibrator can be determined using the detection signal corresponding to the Coriolis force detected by the detecting unit.

According to the present invention, even when a tuning fork vibrator is miniaturized, an increase in its resonant frequency can be suppressed. Thus, with the use of such a tuning fork vibrator, a small vibratory gyroscope having satisfactory sensitivity is obtainable. Further, the use of a thin-film structure in a piezoelectric body of the tuning fork vibrator can achieve a low-profile vibratory gyroscope.

The above-described object or other objects, features, and advantages of the present invention will become further apparent from the following description of best mode for carrying out the invention with reference to the attached drawings.

Figure 1:
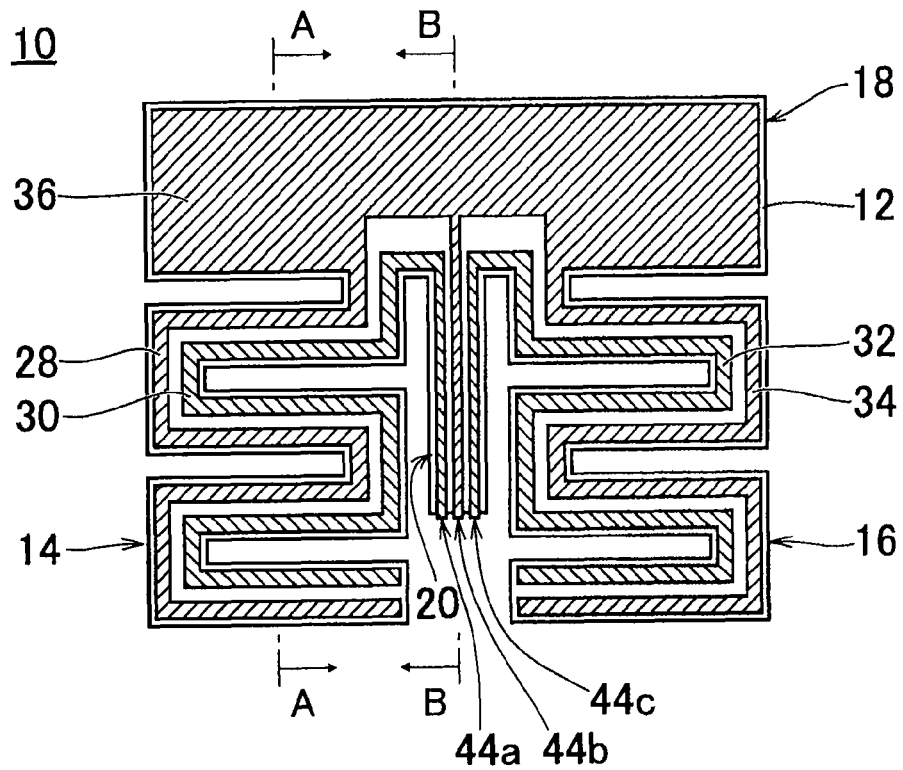
FIG. 1 is a plan view that illustrates one example of a tuning fork vibrator according to the present invention.

REFERENCE NUMERALS 10 tuning fork vibrator
12 vibrating body
14, 16 leg
18 base
20, 89 support
22 substrate
24 SiO$_2$ film
26 piezoelectric film
28, 30, 32, 34 electrode
36 connection electrode 38 common electrode
40 support substrate
42 connection portion
44a, 44b, 44c electrode
50 vibratory gyroscope
R1, R2 resistor
52 self-excited oscillation circuit
54, 56 buffer circuit
58 differential circuit
60 synchronous detection circuit
62 smoothing circuit
64 DC amplifier
70 tuning fork vibrator
72 vibrating body
74, 76 leg
78, 80, 82, 84 electrode

DETAILED DESCRIPTION OF THE INVENTION

Figure 2:
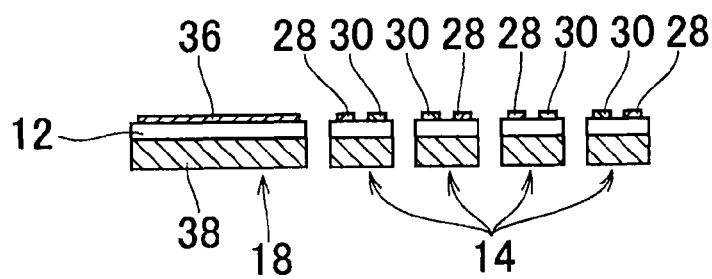
FIG. 2 is a cross-sectional view taken along the line A-A of FIG. 1.
Figure 3:
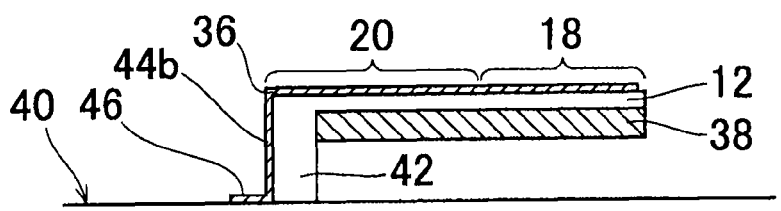
FIG. 3 is a cross-sectional view taken along the line B-B of FIG. 1.

FIG. 1 is a plan view that illustrates one example of a tuning fork vibrator according to the present invention. FIG. 2 is a cross-sectional view taken along the line A-A of FIG. 1. FIG. 3 is a cross-sectional view taken along the line B-B of FIG. 1. A tuning fork vibrator 10 includes a vibrating body 12. The vibrating body 12 includes two legs 14 and 16 extending, for example, in the same direction. First ends of the legs 14 and 16 are coupled together at a base 18. They are formed in the shape of a turning fork as a whole. Each of the two legs 14 and 16 is formed in a meandering shape. That is, each of the legs 14 and 16 is formed such that a plurality of vibrating-reed type vibration elements are arranged in parallel and ends of neighboring vibration elements at different sides are alternately connected, and thus each of the legs 14 and 16 meanders.

The external ends of the vibration elements of each of the two legs 14 and 16 are connected at a corresponding position and the internal ends thereof are connected at a corresponding position. Thus, the two legs 14 and 16 are formed so as to have line symmetry with respect to an intermediate line therebetween. A support 20 is formed so as to extend from the base 18 in the same direction as the legs 14 and 16. The support 20 is formed such that it extends to the position serving as the node when the two legs 14 and 16 vibrate so as to open and close.

Figure 4:
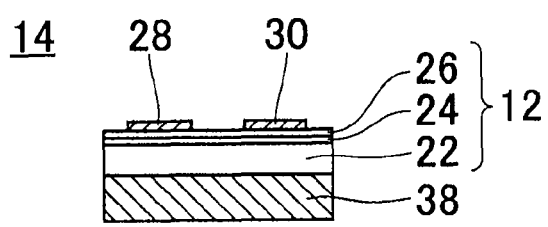
FIG. 4 is a cross-sectional view of legs of the tuning fork vibrator shown in FIG. 1.

As illustrated in FIG. 4, which is a cross-sectional view of the leg 14 in its width direction, the vibrating body 12 includes a substrate 22 made of a non-piezoelectric material. A silicon dioxide ($SiO_2$) film 24 is formed on a first principal surface of the substrate 22. Further, a piezoelectric film 26 made of, for example, aluminium nitride (AlN) is formed on the $SiO_2$ film 24. The substrate 22, the $SiO_2$ film 24, and the piezoelectric film 26 form the vibrating body 12. Electrodes 28 and 30 and electrodes 32 and 34 arranged separately in the width direction are formed on first principal surfaces of the legs 14 and 16, respectively, i.e., on the piezoelectric film 26. The electrodes 28 and 34 formed outward on the two legs 14 and 16 arranged alongside are connected to a connection electrode 36 formed on the base 18. The connection electrode 36 is drawn out so as to extend toward the central part of the support 20 in the width direction. The electrodes 30 and 32 formed inward on the legs 14 and 16 are drawn out so as to extend along both sides of the support 20 in the width direction through the base 18. A common electrode 38 is formed on a second principal surface of the vibrating body 12, i.e., on the substrate 22.

As illustrated in FIG. 3, the tuning fork vibrator 10 is supported on a support substrate 40. Supporting the tuning fork vibrator 10 to the support substrate 40 is carried out by attaching the support 20 to the support substrate 40 using a columnar connection portion 42. Electrodes 44a, 44b, and 44c are formed on sides of the columnar connection portion 42. The electrode 44a is connected to the electrode 30 of the leg 14 being one of the two legs; the electrode 44b is connected to the connection electrode 36; the electrode 44c is connected to the electrode 32 of the leg 16 being the other of the two legs. Thus, the electrode 44b is connected to the electrodes 28 and 34 formed on the two legs 14 and 16. Each of the electrodes 44a, 44b, and 44c formed on the connection portion 42 is connected to, for example, an electrode 46 formed on the support substrate 40. The electrodes 44a, 44b, and 44c are connected to the different electrodes 46.

To fabricate the tuning fork vibrator 10, the substrate 22, for example, a rectangular silicon substrate is prepared. A columnar portion constituting the connection portion 42 is formed at a predetermined position of the substrate 22. The columnar portion is made of, for example, an insulting material, such as a piezoelectric substance or dielectric substance. Further, the $SiO_2$ film 24 is formed by a deposition method, such as thermal oxidation or sputtering, on a principal surface of the substrate 22 opposite to the principal surface at which the columnar portion is formed. Furthermore, the piezoelectric film 26 made of AlN is formed by a deposition method, such as reactive RF magnetron sputtering, vapor deposition, or chemical-vapor deposition (CVD) on the $SiO_2$ film 24. The $SiO_2$ film 24 and the piezoelectric film 26 are patterned so as to have the shape of a tuning fork vibrator.

An electrode material, gold, is deposited by, for example, lift-off vapor deposition on the piezoelectric film 26 and a side of the columnar portion constituting the connection portion 42, and the electrodes 28, 30, 32, and 34, the connection electrode 36, and the electrodes 44a, 44b, and 44c are formed by shaping using patterning. The common electrode 38 is formed using an electrode material, such as gold, by, for example, lift-off deposition on the surface of the substrate 22 where the columnar portion constituting the connection portion 42 is formed. To form the common electrode 38, a thin metal plate may be attached on the substrate 22 in advance.

Finally, the substrate 22 is processed so as to have the shape of the tuning fork vibrator 10. One example processing method is a method of making the shape of the tuning fork vibrator 10 by removing an unnecessary portion using, for example, sandblasting. In such a way, the tuning fork vibrator 10 is obtainable.

Figure 5:
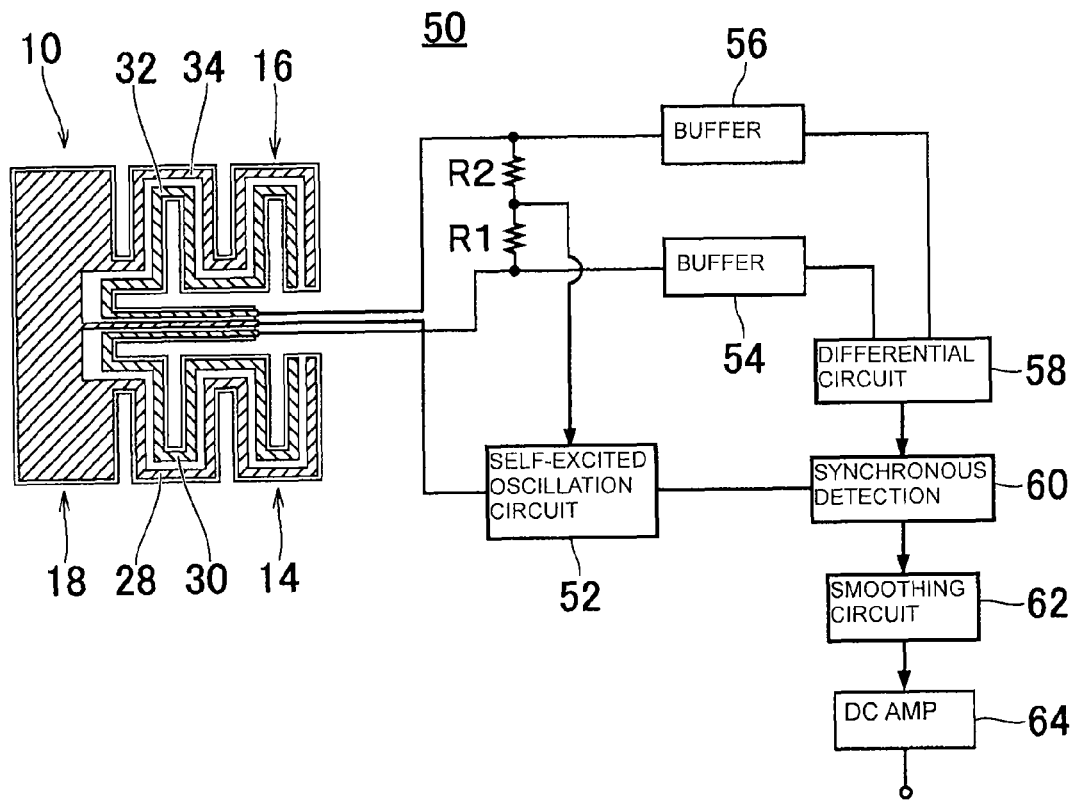
FIG. 5 is a diagrammatic illustration of one example of a vibratory gyroscope that uses the tuning fork vibrator shown in FIG. 1.

As illustrated in FIG. 5, the tuning fork vibrator 10 is used as a vibratory gyroscope 50, for example. In this case, the common electrode 38 of the tuning fork vibrator 10 is connected to the ground. The inner electrodes 30 and 32 of the legs 14 and 16 are connected to resistors R1 and R2. A self-excited oscillation circuit 52 serving as a driving unit is connected between the connection electrode 36 and an intermediate point between the resistors R1 and R2. The self-excited oscillation circuit 52 includes an automatic gain control (AGC) circuit, a phase correction circuit, and a driving amplifier circuit. Signals output from the electrodes 30 and 32 are combined by the resistors R1 and R2, and the combined signal is phase-corrected and amplified. The resultant signal is applied to the connection electrode 36, i.e., the electrodes 28 and 34 of the two legs 14 and 16.

The electrodes 30 and 32 are connected to buffer circuits 54 and 56, respectively. Output signals from the buffer circuits 54 and 56 are input to a differential circuit 58. An output signal from the differential circuit 58 is input to a synchronous detection circuit 60. The synchronous detection circuit 60 is connected to the self-excited oscillation circuit 52 and detects an output signal from the differential circuit 58 in synchronization with a signal from the self-excited oscillation circuit 52. An output signal from the synchronous detection circuit 60 is input to a smoothing circuit 62. An output signal from the smoothing circuit 62 is input to a direct-current (DC) amplifier 64. The differential circuit 58, the synchronous detection circuit 60, the smoothing circuit 62, the DC amplifier 64, and the like constitute a detecting unit for detecting a signal generated when an angular velocity of rotation is applied to the vibratory gyroscope 50. The tuning fork vibrator 10 is connected to the circuits through the electrodes 44a, 44b, and 44c formed on the connection portion 42.

Figure 6:
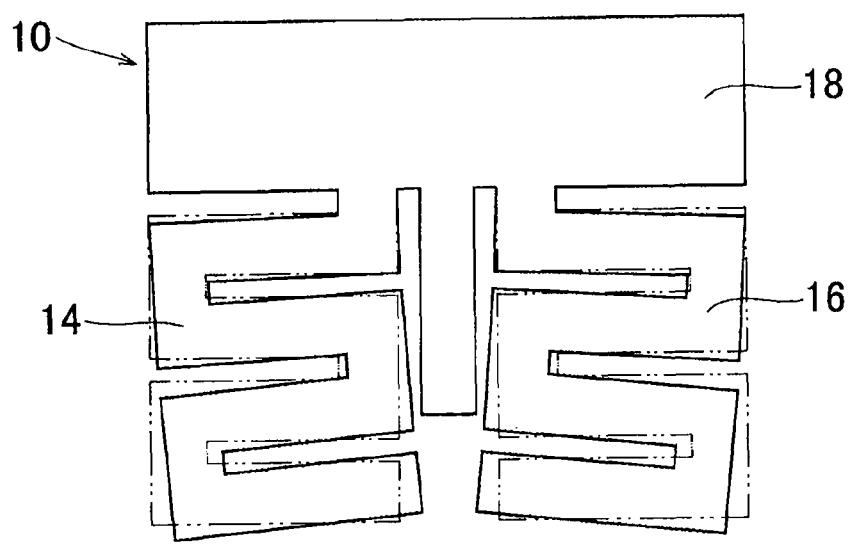
FIG. 6 is a diagrammatic illustration that illustrates a vibrating state of the tuning fork vibrator shown in FIG. 1.

In the vibratory gyroscope 50 described above, the legs 14 and 16 of the tuning fork vibrator 10, the electrodes 30 and 32, the resistors R1 and R2, the self-excited oscillation circuit 52, and the electrodes 28 and 34 form a self-excited loop. Due to this, as illustrated in FIG. 6, the tuning fork vibrator 10 is exited so as to have opening and closing vibrations in which open ends of the legs 14 and 16 approach or move away from each other. At this time, the node of the entire tuning fork vibrator 10 is the distal end of the support 20, i.e., the portion supported by the support substrate 40 with the connection portion 42.

When an angular velocity of rotation about an axis parallel to the two legs 14 and 16 is applied in such a vibrating state, the two legs 14 and 16 are subjected to flexural vibrations in their width directions by Coriolis forces. At this time, the Coriolis forces of opposite directions act on the legs 14 and 16. Thus, the legs 14 and 16 are subjected to the flexural vibrations in opposite directions. In addition to signals having the same phase generated by vibrations of the legs 14 and 16 during non-rotation, signals having opposite phases generated by vibrations caused by the Coriolis forces are output from the electrodes 30 and 32.

Signals output from the electrodes 30 and 32 are amplified by the buffer circuits 54 and 56, respectively. Only signals having opposite phases, i.e., signals generated by the Coriolis forces are extracted by the differential circuit 58. The signals generated by the Coriolis forces are synchronously detected by the synchronous detection circuit 60, smoothed by the smoothing circuit 62, and, additionally, amplified by the DC amplifier 64. Accordingly, an angular velocity of rotation applied to the tuning fork vibrator 10 can be detected by the use of measurement of an output signal from the DC amplifier 64.

Because the legs 14 and 16 are formed in a meandering shape in the tuning fork vibrator 10, the length of each of the meandering legs 14 and 16 as a vibrator can be longer than the direct distance from the base 18 to the distal end of each of the legs 14 and 16. Therefore, even when the tuning fork vibrator 10 has a small size, the length of each of the legs 14 and 16 as a vibrator can be maintained at a longer one, so an increase in the resonant frequency of the tuning fork vibrator 10 can be suppressed.

As described above, with the use of the tuning fork vibrator 10, even when the tuning fork vibrator 10 is miniaturized, the vibratory gyroscope 50 having a low resonant frequency is obtainable. Accordingly, when the vibratory gyroscope 50 is incorporated in a camcorder, the tuning fork vibrator 10 can be excited at a resonant frequency having a small difference to a frequency corresponding to a camera shake. Consequently, the vibratory gyroscope 50 having a small size and satisfactory sensitivity to a camera shake is obtainable. In addition, the use of the piezoelectric film 26 as a piezoelectric body can reduce the thickness of the tuning fork vibrator 10 and thus can achieve the low-profile tuning fork vibrator 10. Further, because the use of the piezoelectric film 26 enables the tuning fork vibrator 10 to be fabricated using a thin-film process, it is easy to miniaturize the tuning fork vibrator 10.

Because a temperature coefficient of the Young's modulus of AlN formed as the piezoelectric film 26 is negative, the frequency of a detection signal may vary with the temperature, so an accurate angular velocity of rotation may be undetectable. To address this, a combination with the $SiO_2$ film 24 having a positive temperature coefficient of the Young's modulus enables a stable temperature characteristic of the frequency of a detection signal.

The vibrating body 12 may have a configuration different from the configuration in which the $SiO_2$ film 24 and the piezoelectric film 26 are formed on the substrate 22 by a thin film process. For example, the configuration in which two piezoelectric substrates each having the shape of the vibrating body 12 are laminated such that these piezoelectric substrates are polarized in opposite thickness directions may be used. Alternatively, the configuration in which a piezoelectric substrate and a non-piezoelectric substrate each having the shape of the vibrating body 12 are laminated may also be used. Even for the tuning fork vibrator 10 using the vibrating body 12 having such a configuration, the length of each of the legs 14 and 16 as a vibrator can be maintained at a longer one by the formation of the legs 14 and 16 in a meandering shape. Accordingly, the tuning fork vibrator 10 can have a small size and a low resonant frequency. The tuning fork vibrator 10 having the two legs 14 and 16 may have three or more legs extending along the same direction as the longitudinal direction of the legs 14 and 16. With this configuration, the angular velocity of rotation can be detected more accurately. The tuning fork vibrator 10 includes the support 20 between the two legs 14 and 16. However, the base 18 may serve as the support.

Figure 7:
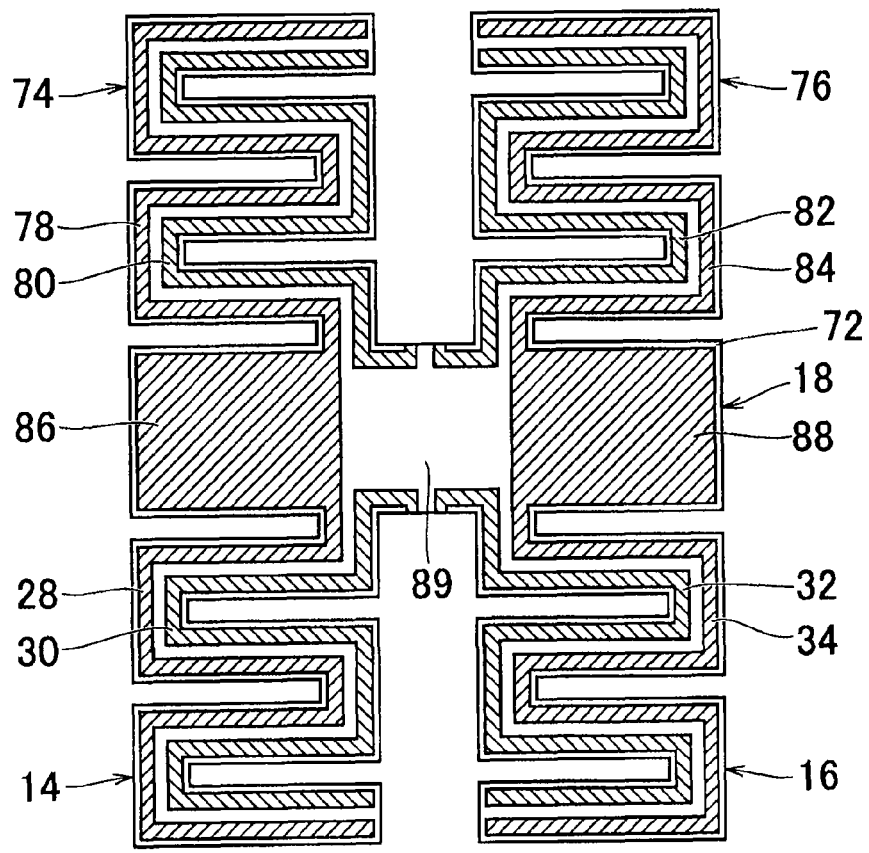
FIG. 7 is a plan view that illustrates another example of the tuning fork vibrator according to the present invention.
Figure 8:
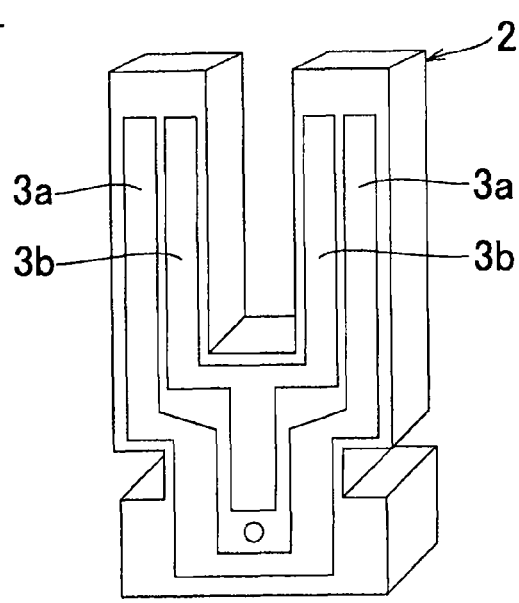
FIG. 8 is a perspective view of one example of a traditional tuning fork vibrator, looking from a first side.
Figure 9:
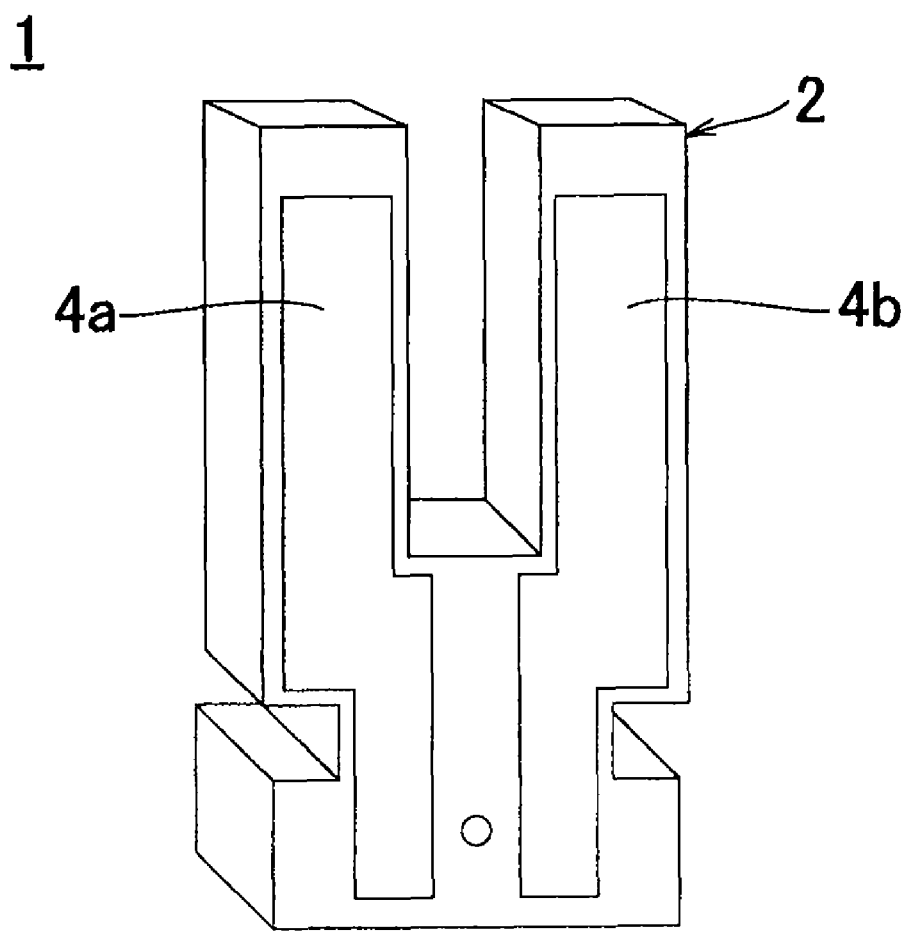
FIG. 9 is a perspective view of the traditional tuning fork vibrator shown in FIG. 8, looking from a second side.
Figure 10A:
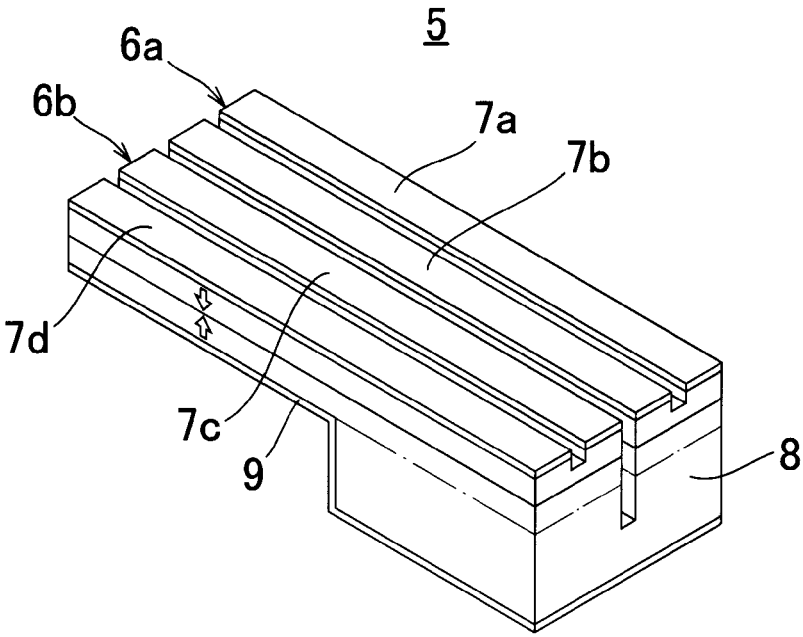
FIGS. 10(a) and 10(b) are perspective views of another example of a traditional tuning fork vibrator, looking from different directions.
Figure 10B:
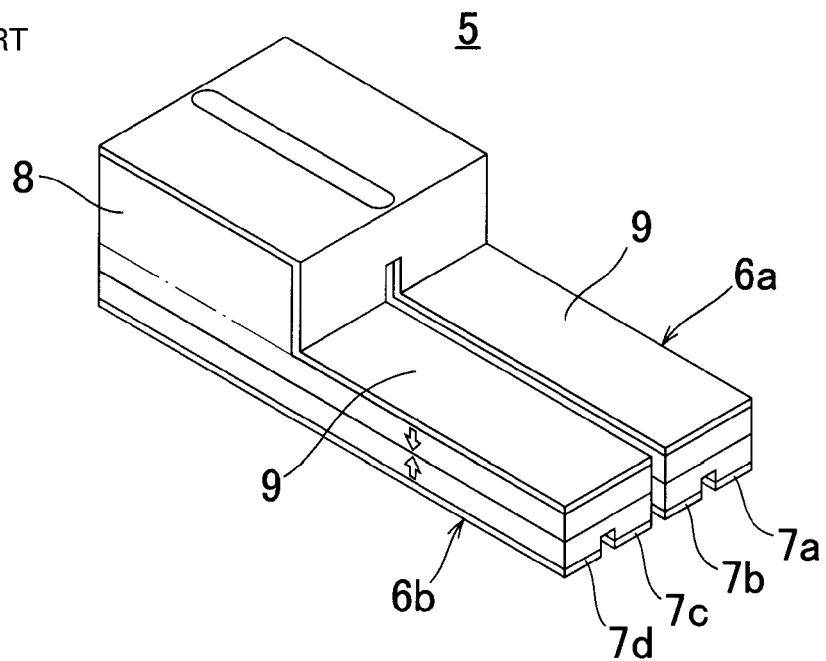

As illustrated in a tuning fork vibrator 70 shown in FIG. 7, a vibrating body 72 exhibiting an H shape as a whole and being formed such that a plurality of legs are symmetric with respect to the base 18 may be used. In the vibrating body 72, the legs 14 and 16 and legs 74 and 76 are formed at both sides of the base 18. The electrodes 28, 30, 32, and 34 are formed on the legs 14 and 16, as in the case of the tuning fork vibrator 10 illustrated in FIG. 1. Similarly, electrodes 78 and 80 arranged separately in the width direction are formed on a first principal surface of the leg 74, and electrodes 82 and 84 arranged separately in the width direction are formed on a first principal surface of the leg 76.

Common electrodes 86 and 88 are formed on both sides on a first principal surface of the base 18 so as not to be formed on a support 89 supporting the legs 14 and 16 and the legs 74 and 76. The common electrode 86 being one of the common electrodes is connected to the electrode 28 of the leg 14 and the electrode 78 of the leg 74. The common electrode 88 being the other of the common electrodes is connected to the electrode 34 of the leg 16 and the electrode 84 of the leg 76. The electrodes 30 and 32 of the legs 14 and 16 and the electrodes 80 and 82 of the legs 74 and 76 are drawn out between the legs 14 and 16 and between the legs 74 and 76, respectively, through the support 89. The common electrode 38 is formed on a second principal surface of the vibrating body 72.

In the tuning fork vibrator 70 having the above configuration, the two tuning fork vibrators are arranged symmetrically with respect to the base 18. Thus, the amount of a change in voltage generated in the piezoelectric film 26 by the application of an angular velocity of rotation to the tuning fork vibrator 70 is increased. Measuring this voltage change enables an accurate detection of the angular velocity of rotation.

The invention claimed is:

1. A tuning fork vibrator comprising:
   a base;
   a plurality of legs attached to the base at respective first ends thereof, each of the plurality of legs having a first principal surface and a second principal surface and having a meandering shape, wherein at least two of the plurality of legs extend along a same longitudinal direction; and
   two electrodes positioned on the first principal surface of each of the at least two legs and separated in a width direction thereof.

2. The tuning fork vibrator according to claim 1, wherein the plurality of legs are formed symmetrically with respect to the base.

3. The tuning fork vibrator according to claim 1, wherein each of the plurality of legs includes a plurality of vibrating-reed type vibration elements arranged in parallel and alternatively connected at different ends thereof.

4. The tuning fork vibrator according to claim 1, further comprising an elongated support extending from the base and positioned between the plurality of legs.

5. The tuning fork vibrator according to claim 4, wherein the support extends to a position corresponding to a node of the at least two legs.

6. The tuning fork vibrator according to claim 1, wherein each of the plurality of legs includes a vibrating body in which two piezoelectric substrates polarized in thickness directions thereof are bonded, and polarization directions of the two piezoelectric substrates are opposite to each other.

7. The tuning fork vibrator according to claim 1, wherein each of the plurality of legs comprises a piezoelectric substrate polarized in a thickness direction thereof and a non-piezoelectric substrate bonded thereto.

8. The tuning fork vibrator according to claim 1, wherein each of the plurality of legs comprises a non-piezoelectric substrate and a piezoelectric film, the piezoelectric film being formed on a first principal surface of the non-piezoelectric substrate and polarized in a thickness direction thereof.

9. The tuning fork vibrator according to claim 1, further comprising a connection electrode on the base, the connection electrode connected to a first of the two electrodes on each of the at least two legs.

10. The tuning fork vibrator according to claim 4, further comprising a connection electrode on the base, the connection electrode connected to a first of the two electrodes on each of the at least two legs and extending toward a central part of the support.

11. The tuning fork vibrator according to claim 10, wherein a second of the two electrodes on each of the at least two legs extend along the support.

12. The tuning fork vibrator according to claim 4, wherein a first of the two electrodes on each of the at least two legs extend along the support.

13. The tuning fork vibrator according to claim 4, wherein the support is attached to a support substrate with a connection portion.

14. A vibratory gyroscope comprising:
   the tuning fork vibrator according to claim 1;
   a driving unit that applies a driving signal to a first of the two electrodes on each of the at least two legs of the tuning fork vibrator; and
   a detecting unit that detects a signal generated in a second of the two electrodes of each of the at least two legs of the tuning fork vibrator.

* * * * *